US006181234B1

(12) United States Patent
Szwarc et al.

(10) Patent No.: US 6,181,234 B1
(45) Date of Patent: Jan. 30, 2001

(54) MONOLITHIC HEAT SINKING RESISTOR

(75) Inventors: Joseph Szwarc, Ramat Gan (IL); Joel J. Smejkal, Columbus, NE (US)

(73) Assignee: Vishay Dale Electronics, Inc., Columbus, NE (US)

(*) Notice: Under 35 U.S.C. 154(b), the term of this patent shall be extended for 0 days.

(21) Appl. No.: 09/474,448

(22) Filed: Dec. 29, 1999

(51) Int. Cl.7 .......... H01L 1/08

(52) U.S. Cl. .......... 338/53; 338/206; 338/208; 338/329; 338/322; 338/325

(58) Field of Search .......... 338/49, 53, 51, 338/57, 58, 206, 208, 315, 316, 322, 325, 324, 329, 330

(56) References Cited

U.S. PATENT DOCUMENTS

| | | | | |
|---|---|---|---|---|
| 696,757 | | 4/1902 | Rypinski . | |
| 765,889 | | 7/1904 | Harris, Shunt . | |
| 779,737 | | 1/1905 | Robinson . | |
| 859,255 | | 7/1907 | Roller . | |
| 1,050,563 | | 1/1913 | Roller . | |
| 2,003,625 | | 6/1935 | Boyer | 201/63 |
| 2,271,995 | | 2/1942 | Baroni | 201/76 |
| 2,708,701 | | 5/1955 | Viola | 201/62 |
| 2,736,785 | | 2/1956 | DuBois | 201/69 |
| 3,245,021 | | 4/1966 | Kernander | 338/49 |
| 3,497,859 | * | 2/1970 | Bang | 338/309 |
| 4,286,249 | | 8/1981 | Lewis et al. | 338/275 |
| 4,297,670 | * | 10/1981 | Solow | 338/195 |
| 4,317,104 | * | 2/1982 | Bergmann et al. | 338/330 |
| 4,339,743 | * | 7/1982 | Ludwig | 338/206 |
| 4,684,916 | | 8/1987 | Ozawa | 338/308 |
| 4,689,475 | | 8/1987 | Kleiner et al. | 219/553 |
| 4,800,253 | | 1/1989 | Kleiner et al. | 219/553 |
| 4,803,345 | * | 2/1989 | Hoshizaki et al. | 338/325 |
| 4,991,059 | * | 2/1991 | Kiyose | 338/329 |
| 4,993,142 | | 2/1991 | Burke et al. | 29/621 |
| 5,214,407 | * | 5/1993 | McKim Jr. et al. | 338/49 |
| 5,218,334 | * | 6/1993 | Bartlett | 338/61 |
| 5,223,820 | * | 6/1993 | Sutterlin et al. | 340/641 |
| 5,604,477 | | 2/1997 | Rainer et al. | 338/293 |
| 5,896,077 | * | 4/1999 | Cadwallader | 338/324 |

FOREIGN PATENT DOCUMENTS 93 20 911 8/1995 (DE) .

OTHER PUBLICATIONS

Advances in Connector Design Using Electron Beam Welded Strip, R. M. Grubb and D.W.M. Williams, Technical Materials, Inc., Lincoln RI (No Date).

EB–welded Dual–Metal Strip Aids Contact Fabrication, Reprinted Nov. 1978 issue of: Electronic Packaging and Production.

* cited by examiner

*Primary Examiner*—Karl D. Easthom
(74) *Attorney, Agent, or Firm*—Zarley, McKee, Thomte, Voorhees & Sease

(57) ABSTRACT

A monolithic resistor is provided with a central resistive metallic foil strip positioned between and attached to a pair of wings formed from an electrically conductive metallic foil. The wings include large surface areas to dissipate heat. A plurality of terminal pins are formed in the conductive strips for connection to an integrated circuit board, as well as a current source.

19 Claims, 1 Drawing Sheet

MONOLITHIC HEAT SINKING RESISTOR

BACKGROUND OF THE INVENTION

Conventional resistors dissipate heat through connecting pins and pads to a printed circuit board, and through their body to the environment. Other known very low value resistors utilize a planar resistor bonded to a metallic substrate with an insulating laminate for mounting on a heat sink. These existing resistors are not suitable for certain applications, such as a very low value high power resistor with a resistance of less than 1 milliohm which must carry high currents. Since the conventional resistors are constructed to conduct the heat generated in them mainly to the printed circuit, such resistors are not well suited for the absorption of high current, continuously or in pulses, without causing an excessive temperature rise of the printed circuit or an equivalent support on which it is mounted. Furthermore, the construction of conventional resistors are generally not suitable for mounting with low thermal resistance to a heat sink for further reduction of temperature rise, low inductance for high frequency applications.

Accordingly, a primary objective of the present invention is a provision of an improved monolithic heat sink resistor.

Another objective of the present invention is a provision of a very low value resistor.

A further objective of the present invention is a provision of a resistor which is useful for the absorption of high current, continuously or in pulses, without causing an excessive temperature rise.

Another objective of the present invention is the provision of a resistor to which an additional heat sink can be mounted with a low thermal resistance of the interface.

Another objective of the present invention is the provision of a resistor having low inductance for high frequency applications.

A further objective of the present invention is the provision of a monolithic resistor having terminal connections for accurate sensing of voltage drop.

These and other objections will become apparent from the following description of the invention.

SUMMARY OF THE INVENTION

A monolithic resistor with heat sinks is constructed of a plurality of metallic foil strips. The center strip is an elongated narrow strip of electrically resistive material, such as nickel chromium alloy. A wide strip of electrically and thermally conductive material, such as copper, is provided on each side of the resistive strip. A plurality of terminal pins are formed in the conductive strips. The terminal pins may be solder coated. The conductive strips have a substantial width, in comparison to the narrow width of the resistive strip, so as to function as a heat sink and increase the heat capacity for pulse applications. The high length to width ratio results in a low thermal resistance. Additional heat sinks may be connected to the conductive strips to further dissipate heat generated by the resistor.

DETAILED DESCRIPTION OF THE DRAWINGS

Figure 2:
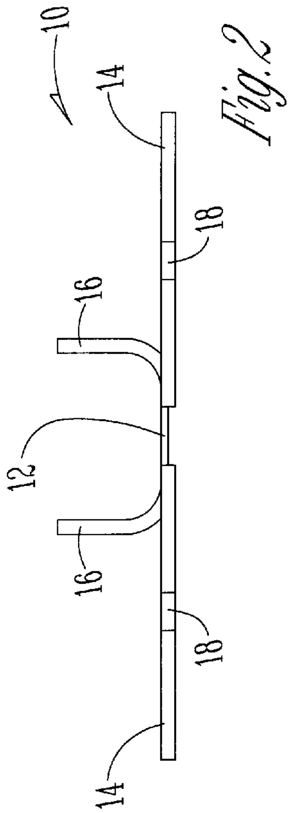
FIG. 2 is a side elevation view of the resistor.

The monolithic metal strip resistor of the present invention is generally designated in the drawings by the reference numeral 10. The resistor 10 is comprised of a central strip 12 constructed of an electrically resistive metallic foil, such as nickel chromium alloy. It is understood that other known resistive materials may be used, such as nickel iron or a copper based alloy.

The resistor 10 also includes spaced apart wings 14 constructed of an electrically conductive metallic foil, such as copper. The copper strips 14 are welded or otherwise attached to the opposite side edges of the resistive strip 12. Preferably, the joined strips 12, 14 are manufactured using the process described in Applicant's Pat. No. 5,604,477, which is incorporated herein by reference.

Figure 1:
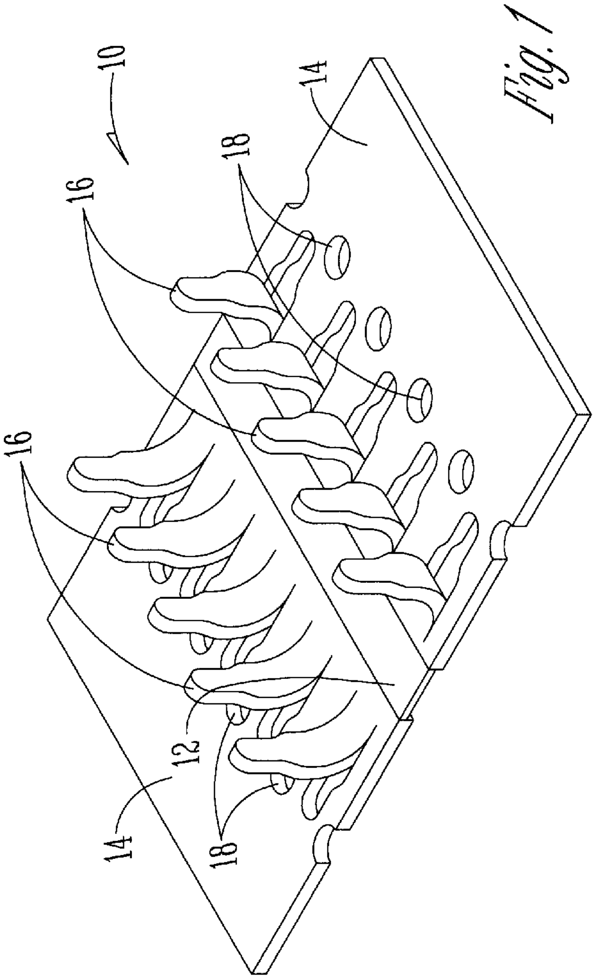
FIG. 1 is a perspective view of the resistor of the present invention.
Figure 3:
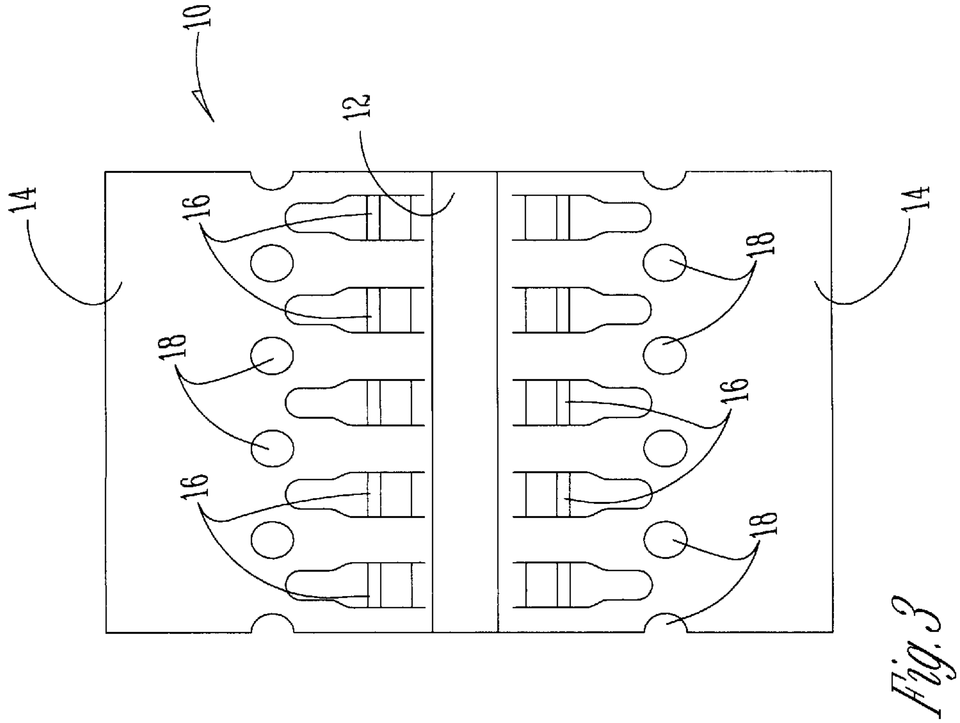
FIG. 3 is a top plan view of the resistor.

As best seen in FIGS. 1 and 2, the conductive strips 14 have a width which is substantially greater than the width of the resistive strip 12. In the embodiment shown in the drawings, the width of the conductive strips 14 is approximately five times greater than that of the resistive strip 12. The large surface area of the wings 14 provides effective heat sinks for the dissipation of heat. These heat sinks absorb short pulses of electrical power, thus reducing the peak temperature and contributing to the dissipation of the generated heat.

As seen in FIG. 2, the thickness of the conductive strips 14 is also greater than the thickness of the resistive strip 12. This thickness differential permits the resistor 10 to be mounted on a support surface with the resistive strip 12 suspended above the supporting surface.

A plurality of terminal pins 16 are formed in each of the electrically conductive strips or wings 14. The pins 16 are pressed or stamped from the metallic foil of the strips 14 and bent so as to extend substantially perpendicularly to the plane of the strips 14. Preferably, the pins 16 are solder coated for ease of connection to an integrated circuit board or to a current source. The pins reduce the current density and the heat generated in the connections. Two pins 16 can serve for sensing of voltage drop. Holes in the wings can also be used for connection of voltage sensing wires.

The conductive strips 14 also include a plurality of index holes 18 which can be used for the attachment of additional electrically conductive strips or wings to function as an additional heat sink.

It is understood that the resistive strip 12 of the resistor 10 may be encapsulated with a dielectric encapsulating material (not shown) to provide protection from various environments to which the resistor 10 may be exposed, to add rigidity to the resistor, and to insulate the resistor from other components or metallic surfaces it may contact during operation. Such an encapsulating material only covers the resistive strip 12, with the conductive strips 14 being left exposed.

The construction of the resistor 10 provides a path of low thermal resistance for the dissipation or evacuation of heat from the resistor to the ambient environment via the large exposed surfaces of the conductive strips or wings 14. If the heat storing and dissipation capacity of the wings 14 is not sufficient, and further reduction of temperature rise is desired, an additional heat sink can be attached to the surface of the wings with interposition of an electrically insulating heat transfer pad. A low thermal resistance of the interface is achieved due to the large area of the wings 14. Another construction option is the direct attachment of two separate heat sinks, one to each of the wings 14, without electrical insulation.

It is understood that the cross-section and length of the resistive strip 12 determines the ohmic value of the resistor. For example, a preferred dimension of the resistive strip 12 is 0.014 inches thick, a length of 0.400 inches and 0.100 inches in width. Such a construction will yield a maximum resistance of 1 milliohm. The resistive value can be adjusted to achieve a requested accuracy by conventional methods, such as laser trimming or mechanical abrasion.

The invention has been shown and described above with the preferred embodiments, and it is understood that many modifications, substitutions, and additions may be made which are within the intended spirit and scope of the invention. From the foregoing, it can be seen that the present invention accomplishes at least all of its stated objectives.

What is claimed is:

1. A heat sink resistor comprising:

a resistive strip made of an electrically resistive first material having opposite side edges;

conductive strips made of an electrically and thermally conductive second material attached to the opposite side edges of the strip of resistive material;

a plurality of terminal pins formed in the strips of conductive material; and the conductive strips having a width substantially greater than the width of the resistive strip so as to form a heat sink on each side edge of the resistive strip.

2. The heat sink resistor of claim 1 further comprising a plurality of indexing holes in each of the conductive strips.

3. The heat sink resistor of claim 1 wherein the terminal pins are punched and bent from the conductive strips.

4. The heat sink resist of claim 1 wherein the width of the conductive strips are at least three times the width of the resistive strip.

5. The heat sink resistor of claim 1 wherein the width of the conductive strips are at least five times the width of the resistive strip.

6. The heat sink resistor of claim 1 wherein the conductive strips are thicker than the resistive strip.

7. The heat sink resistor of claim 1 wherein the resistive strip has a maximum resistance of 1 milliohm.

8. The heat sink resistor of claim 1 wherein the resistive material is selected from a group comprising nickel chromium alloy, nickel iron and a copper-based alloy, and the conductive material is copper.

9. A monolithic metal strip resistor comprising:

a pair of spaced apart heat sinking wings formed of electrically conductive metal foil;

a strip of electrically resistive metal foil extending between the wings;

a plurality of terminal pins formed in each wing; and the conductive metal foil and the resistive metal foil being different materials.

10. The strip resistor of claim 9 wherein the strip has a maximum resistance of 1 milliohm.

11. The strip resistor of claim 9 wherein the wings and the strip each have widths, and the wing widths being greater than the strip width.

12. The strip resistor of claim 9 wherein the wing widths are at least three times greater than the strip width.

13. The strip resistor of claim 9 wherein each wing includes a plurality of indexing holes.

14. The strip resistor of claim 9 wherein the wings and strip each have a thickness, and the thickness of the wings being greater than the thickness of the strip.

15. The strip resistor of claim 9 wherein two of the pins may be used to sense voltage drop.

16. The strip resistor of claim 9 wherein the wings may be used to sense voltage drop.

17. The monolithic metal strip resistor of claim 9 wherein the resistive metal foil is selected from a group comprising nickel chromium alloy, nickel iron and a copper-based alloy, and the conductive material is copper.

18. A monolithic resistor, comprising:

a plurality of separate metallic foil strips joined together to form the resistor;

a first one of the strips being a resistive material;

a second one of the strips being a conductive material; and a plurality of terminal pins stamped in the conductive material.

19. The monolithic resistor of claim 18 wherein a third one of the strips is a conductive material with terminal pins stamped therein, the first strip being between the second and third strips.

* * * * *